United States Patent [19]

Beurrier

[11] 3,868,584

[45] Feb. 25, 1975

[54] AMPLIFIER WITH INPUT AND OUTPUT MATCH

[76] Inventor: Henry Richard Beurrier, Chester Township, Morris County, N.J.

[22] Filed: Feb. 8, 1971

[21] Appl. No.: 113,200

[52] U.S. Cl. ................ 330/124 R, 330/165, 330/20

[51] Int. Cl. ............................................ H03f 3/68

[58] Field of Search ...... 333/11, 10; 330/53, 124 R, 330/165

[56] References Cited

UNITED STATES PATENTS

| | | | |
|---|---|---|---|
| 2,775,657 | 12/1956 | Van Zelst | 330/124 R UX |
| 3,336,540 | 8/1967 | Kwartiroff et al. | 330/124 R X |
| 3,360,739 | 12/1967 | Cooke-Yarborough | 330/124 R |
| 3,585,516 | 6/1971 | Ricagni | 330/124 R X |

*Primary Examiner*—Nathan Kaufman
*Attorney, Agent, or Firm*—S. Sherman

[57] ABSTRACT

This application describes an amplifier comprising two active stages having mutually inverse input and output impedances whose magnitudes are at least an order of magnitude greater or less than the impedances of the external circuits to which the amplifier is connected. At the input end, the signal source is coupled directly, or by means of a transformer, to the high input impedance active element, and through a matching series impedance to the low input impedance active element. Similarly, the high output impedance active element is coupled directly, or through a transformer, to the useful output load, while the low output impedance active element is coupled thereto through a series impedance.

13 Claims, 10 Drawing Figures

INVENTOR
H. R. BEURRIER
BY Sylvan Sherman
ATTORNEY

AMPLIFIER WITH INPUT AND OUTPUT MATCH

This invention relates to impedance matched amplifiers.

BACKGROUND OF THE INVENTION

It is a very common practice to employ amplifiers whose input and output impedances are significantly different than the impedances of the circuits to which they are connected. In a communication system, however, large mismatches tend to produce echoes, delay distortion and other deleterious effects which adversely affect its operation and, hence, must be avoided.

It is, accordingly, the broad object of the present invention to match the input and output impedances of an amplifier to its input source and output load.

The simplest way to match unequal impedances is by means of an impedance matching transformer. Such an arrangement, however, can only be used when the two impedances to be matches are uniquely known. The input and output impedances of an amplifier, on the other hand, tend to vary as a function of frequency. Hence, a simple transformer cannot generally be used for this purpose, and, in particular, it cannot be used in association with a wideband amplifier.

It is, therefore, a more specific object of the present invention to match the impedances of an amplifier to its input source and output load over a wide range of frequencies.

SUMMARY OF THE INVENTION

An amplifier, in accordance with the present invention, comprises two active stages having mutually inverse input and output impedances whose magnitudes are at least an order of magnitude greater or less than the impedances of the external circuits to which the amplifier is connected. At the input end, the signal source is coupled directly, or by means of a transformer, to the high input impedance active element, and through a matching series impedance to the low input impedance active element. Similarly, the high output impedance active element is coupled directly, or through a transformer, to the useful output load, while the low output impedance active element is coupled thereto through a series impedance.

It is a feature of the invention that whereas the series impedances provide input and output matches for the amplifier, they neither degrade the noise performance of the amplifier nor absorb any of the useful output energy from the amplifier. In addition, so long as the source impedance and the load impedance differ from the input and output impedances of the active elements by about one order of magnitude or more, variations in the input and output impedances of the active elements do not significantly upset the amplifier match.

These and other objects and advantages, the nature of the present invention, and its various features, will appear more fully upon consideration of the various illustrative embodiments now to be described in detail in connection with the accompanying drawings.

DETAILED DESCRIPTION

Figure 1:
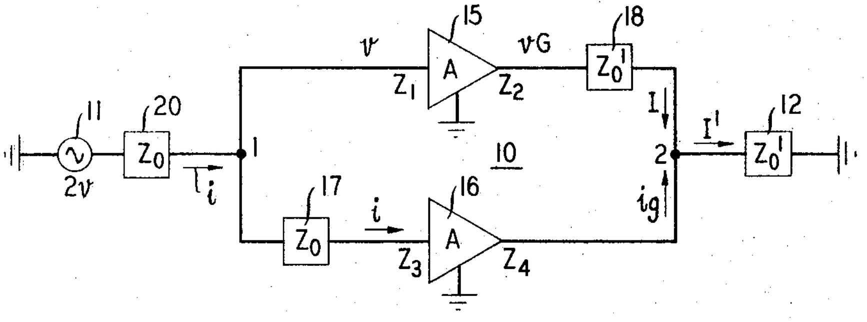
FIG. 1 shows a first embodiment of an amplifier in accordance with the present invention.

Referring to the drawings, FIG. 1 shows, in block diagram, an amplifier 10, in accordance with the present invention, comprising two, parallel-connected active stages 15 and 16, and two impedances 17 and 18 connected, respectively, in series with the input end of stage 16 and the output end of stage 15. A signal source 11, having a source impedance $Z_o$ and an open circuit voltage 2v, is connected to the input port 1 of amplifier 10. An output load 12, having an impedance $Z_o'$, is connected to the amplifier output port 2.

The active stages, which can include one or more active elements, have mutually inverse input and output impedances, where the term "mutually inverse impedances," as used herein, means that relative to some reference impedance, the input impedance of one active stage is much larger (preferably) at least an order of magnitude greater) than the reference impedance, while the input impedance of the other active stage is much smaller (preferably at least one order of magnitude less) than the chosen reference impedance. Similarly, the output impedance of one of the stages is preferably an order of magnitude greater than a second reference impedance while the output impedance of the other stage is preferably an order of magnitude less than this second reference impedance. In an amplifier, in accordance with the present invention, the input impedances are measured relative to the source impedance $Z_o$, and the output impedances are measured relative to the load impedance $Z_o'$. Thus, in the illustrative embodiment of FIG. 1, input impedances $Z_1$ and $Z_3$ are such that $$Z_3 << Z_o << Z_1 \quad (1)$$

and output impedances $Z_2$ and $Z_4$ are such that $$Z_2 << Z_o' << Z_4 \quad (2)$$

Alternatively, the same active stage can have both the higher input as well as the higher output impedance, as will be illustrated in greater detail hereinbelow.

The series impedances 17 and 18 are also defined relative to the terminating impedances. Thus, impedance 17 is equal to the source impedance $Z_o$ and impedance 18 is equal to load impedance $Z_o'$. Their locations, on the other hand, are determined by the input and output impedances of the two stages. Specifically, impedance 17 is placed in series with the lower input impedance stage 16, while impedance 18 is placed in series with the lower output impedance stage 15. If, however, the same stage (15 or 16) has both the lower input impedance and the lower output impedance, the two series impedances 17 and 18 would be located in series, respectively, with the input end and with the output end of this same stage.

To illustrate the operation of the amplifier shown in FIG. 1, signal source 11 is applied to input port 1. Since $Z_1$ is much larger than $Z_o$, (i.e., $Z_1$ is an open circuit,) and $Z_3$ is much less than $Z_o$, (i.e., $Z_3$ is a short circuit,) essentially all the signal source current $i$ flows through impedance 17 into stage 16. This current is given by $$i = 2v/2Z_o \ , \tag{3}$$

or $$i = v/Z_o \ . \tag{4}$$

The voltage at the input to stage 15 is then equal to the voltage across impedance 17, or $$v = iZ_o \ . \tag{5}$$

It will be noted that the total load presented by amplifier 10 to the signal source 11 is that of impedance 17, and since it has the same impedance as the source, the amplifier input presents a match termination for the source.

The signals at the output of stages 15 and 16 are, respectively, vG and ig, where G and $g$ are the stage gain functions.

Designating the output current from stage 15 as I, and the current into load 12 as I', the following voltage and current relationships obtain:

$$vG - IZ_o' = I'Z_o' \tag{6}$$

and $$ig + I = I' \ . \tag{7}$$

Noting, from equation (5), that $v = iZ_o$, we derive for I and I', $$I' = (GZ_o + gZ_o'/2Z_o')\ i \tag{8}$$

and $$I = (GZ_o - gZ_o'/2Z_o)\ i \tag{9}$$

Figure 2:
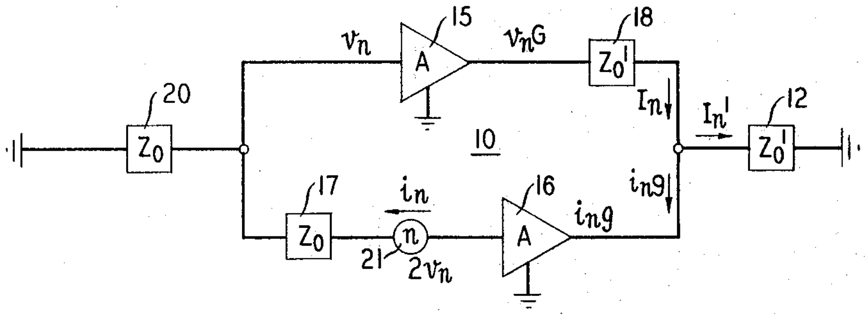
FIG. 2 shows the equivalent noise circuit of the amplifier shown in FIG. 1.

As noted above, impedance 17 match-terminates source 11. Now it will be recognized that a matching terminating impedance can always be shunted across or placed in series with the input of an amplifier. This, however, adversely affects the noise performance of the amplifier and, hence, is not a desirable means of obtaining a match. In an amplifier, in accordance with the present invention, this, however, is not the case. To illustrate this, the effect of impedance 17 upon the noise performance of amplifier 10 can be determined by referring to FIG. 2, which is the same as FIG. 1, except that signal source 11 is replaced by its equivalent impedance 20, equal to $Z_o$, and an equivalent noise generator 21, having an open circuit noise voltage $2v_n$, is included in series with impedance 17. An equivalent noise current, $i_n$, given by $$i_n = 2v_n/2Z_o = v_n/Z_o \ , \tag{10}$$

will flow, producing a noise voltage $$v_n = i_nZ_o \tag{11}$$

at the input of stage 15.

The noise signals at the output of stages 15 and 16, respectively, are $v_nG$ and $i_ng$. It will be noted, however, that the noise signal $i_ng$ is in the opposite direction to the signal, ig, in FIG. 1.

Solving for noise current $I_n$ through impedance 18 and the noise current $I_n'$ through the load 12 in the same manner as for the signal currents hereinabove, we obtain $$I_n = (GZ_o + gZ_o'/2Z_o')i_n \tag{12}$$

$$I_n' = (GZ_o - gZ_o'/2Z_o')\ i_n \ . \tag{13}$$

Advantageously, the noise current through the load is zero, which obtains when $I_n' = 0$, or $$G/g = Z_o'/Z_o \ . \tag{14}$$

Equation (14) states that no noise current will flow into the load when the gain ratio of stage 15 to stage 16 is equal to the ratio of the output impedance $Z_o'$ to the input impedance ratio $Z_o$. As a practical matter, the source and load impedances are typically equal, producing the convenient result that optimum noise performance obtains when $G = g$.

Thus, for amplifier 10, all of the noise power is delivered to impedance 18 and none of it reaches load 12. Accordingly, in an amplifier in accordance with the present invention, the matching impedance has no adverse effect upon the noise performance of the amplifier.

Apply these same conditions to equation (8) and (9), (i.e., $Z_o = Z_o'$ and $g = G$) we obtain $$I = 0 \tag{15}$$

and $$I' = ig \ , \tag{16}$$

which indicate that all the current from stage 16 is delivered to load 11 and that stage 15 delivers no output current.

As indicated hereinabove, amplifier 10 is matched at its input end. A similar condition exists at the output. For example, in the event that a component of signal is reflected from the load back towards the amplifier output end, the reflected signal sees an open circuit, due to the high output impedance of stage 16, in parallel with impedance 18. Since the latter is equal to the load impedance, all of the reflected energy is absorbed in impedance 18 and none is rereflected.

It will thus be noted from the above that stage 15 is only required to develop an output voltage equal to the load voltage, but that it is not required to deliver any output current. As such, stage 15 can be a relatively small active stage, that is required only to handle the current associated with the maximum anticipated reflections from the load. Because it can be much smaller than stage 16, it will have a much lower noise figure. Thus, in an amplifier in accordance with the present invention, the power handling capacity is determined by one, relatively large active stage, whereas the noise figure is determined by another, much smaller stage, capable of having a much better noise figure.

Figure 3:
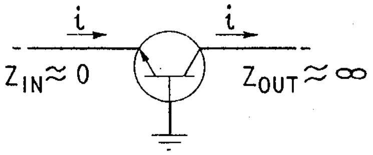
FIGS. 3, 4 and 5 show transistors arranged in a common base configuration, a common collector configuration, and as a Darlington pair.
Figure 4:
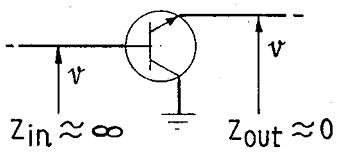

FIGS. 3 through 7, now to be described, illustrate various active stages that can be employed to practice the invention. As is known, a transistor, connected in the common base configuration, as illustrated in FIG. 3, transforms a current $i$, with unity gain, from a low to a high impedance. To within a good approximation, the input impedance $Z_{in}$ of a common base transistor is zero, and its output impedance $Z_{out}$ is infinite. Conversely, a transistor connected in a common collector configuration, as illustrated in FIG. 4, transforms a voltage $v$, with unity gain, from a high impedance to a low impedance. Thus, to within an equally good approximation, the input impedance $Z_{in}$ of a common collector transistor is infinite, and its output impedance $Z_{out}$ is zero.

Figure 5:
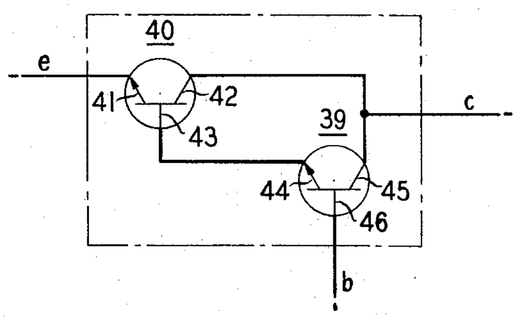

It will be recognized, however, that in a practical case the input and output impedances, if small, will be greater than zero and, if large, will be less than infinite. Nevertheless, relative to a specific source impedance $Z_o$ and a specific load impedance $Z_o'$, they can, for all practical purposes, be considered to be zero or infinite. IF, however, a better approximation is required, a Darlington pair, as illustrated in FIG. 5, can be used. In this arrangement, the base 43 of a first transistor 40 is connected to the emitter 44 of a second transistor 39. The two collectors 42 and 45 are connected together to form the collector $c$ for the pair. The emitter 41 of transistor 43 is the pair emitter $e$, while the base 46 of transistor 39 is the pair base $b$.

The gain factor $\alpha$ for such a pair is given by $$\alpha = \alpha_1 + (1-\alpha_1)\,\alpha_2 , \tag{17}$$

where $\alpha_1$ and $\alpha_2$ are the gain factors for transistors 40 and 41, respectively. If, for example, $\alpha_1$ and $\alpha_2$ are both equal to 0.95, the $\alpha$ for the Darlington pair is then equal to 0.9975. Correspondingly, the input and output impedances for a Darlington pair more nearly approach the ideal values.

Despite the above-described efforts, it is still possible, under certain operating conditions, for the input impedance of the two amplifiers to vary significantly. For example, the input impedance of a transistor tends to vary as a function of signal level. With a 50 ohm source, variations of the impedance of the transistor base circuit would not have a significant effect since it would still be orders of magnitude greater than 50 ohms. However, the emitter impedance might conceivably vary from some small negligible value of less than 5 ohms to a significant value of ten ohms or greater. This would clearly modify the assumed impedance conditions. However, it is a property of this circuit that despite this impedance variation, the power delivered to the load remains a constant, and that any distortion produced as a result of variations in the emitter circuit impedance, is coupled to, and dissipated in series impedance 18. This can be readily illustrated as follows.

Assume, for the purposes of the following discussion, that $Z_o = Z_o'$ and that $G = g = 1$. The current I' delivered to load 12 is then given by equations (8) and (4) as $$I' = i = v/Z_o , \tag{18}$$

and the current I through impedance 18 is given by equation (9) as $$I = 0.$$

If a significant impedance $z$, representing the input impedance of amplifier 16, is added in series with impedance 17, the current $i$ into amplifier 16 is reduced somewhat, and the voltage $e$ applied to amplifier 15 is correspondingly increased. Specifically, $i$ and $e$ are now given by $$i = 2/2Z_o + z \tag{20}$$

and $$e = 2v(Z_0 + z/2\mathbf{Z}_o + Z) . \tag{21}$$

Designating, as before, the output current from stage 15 as I, and the load current as I', we obtain the following relationships for the amplifier output circuit:

$$I' = I + i \tag{22}$$

and $$e = IZ_o + I'Z_o . \tag{23}$$

Substituting in equation (23) for I from equation (22), and for e from equation (21), we obtain $$2v(Z_o + z/2Z_o + z)=(I' - i)\ Z_o + I'Z_o . \tag{24}$$

Solving equation (24) for I' we again derive $$I' = v/Z_o . \tag{25}$$

From equation (22) we obtain for I, $$I = v/Z_o\ (z/2Z_o + z) . \tag{26}$$

It will be noted that the load current I' for large $z$, as given by equation (25), is the same as the load current for $z = 0$, as given by equation (18). Thus, while the added impedance $z$ in the input circuit of stage 16 tends to reduce the input current $i$ to that stage, there is an increase in the input voltage to the other stage 15, and a corresponding increase in the output current I of stage 15 from zero to the value given by equation (26).

This is just enough to compensate for the reduction in the output current from stage 16. The net effect produced thereby is to maintain the load current I' constant. Thus, the signal power delivered to the output load circuit for the two cases is also maintained constant.

The distortion produced by the change in input impedance from zero to $z$ is dissipated in the series impedance 18. Even in the extreme case where there is a complete malfunction in stage 16 such that its input impedance goes from zero to an open circuit (i.e., $i = 0$), the other stage totally compensates for the reduction in the output current from stage 16, and continues to deliver a constant level of power to the load impedance 12. Thus, variations in the input impedance of the lower input impedance stages are not at all critical as such variations merely alter the power distribution between the two stages, shifting some power from stage 16 to the other stage 15 without interfering with the overall operation of the amplifier.

It will be noted that there is an impedance transformation between input and output for each of the transistor configurations illustrated in FIGS. 3 and 4. However, as was noted hereinabove, the same active stage can have both the lower input and output impedances. Conversely, the same stage can have the higher input and output impedances. Active stages of these sorts are illustrated in FIGS. 6 and 7.

Figure 6:
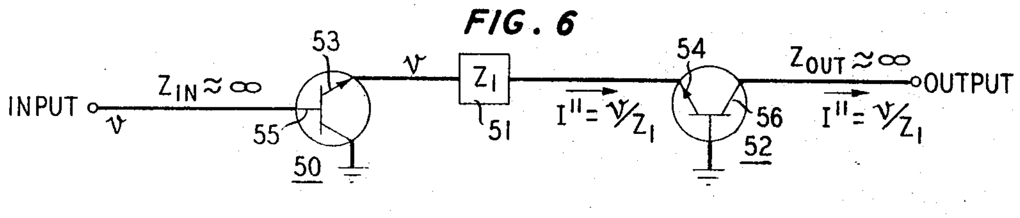
FIGS. 6 and 7 show multielement active stages.

In the emobdiment of FIG. 6, a first transistor 50, connected in the common collector configuration, is coupled to a second transistor 52, connected in the common base configuration, through a series impedance 51. In operation, a voltage $v$ applied to the base 55 of transistor 50 induces a voltage $v$ at the emitter 53 which is impressed across impedance 51. This, in turn, causes a current $v/Z_1$ to flow into the emitter 54 of transistor 52, producing an output current $I = v/Z_1$ in collector 56.

Figure 7:
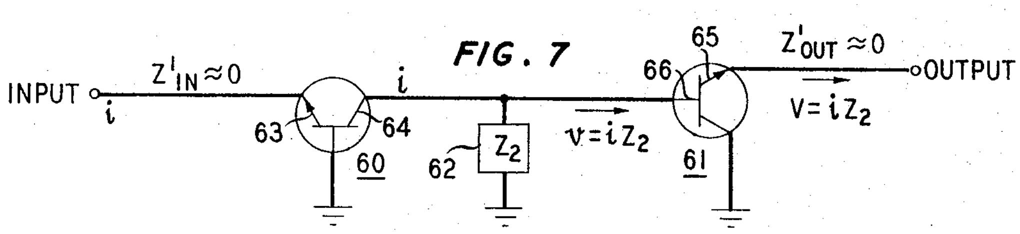

In the embodiment of FIG. 7, a first transistor 60, connected in the common base configuration, is coupled to a second transistor 61 by means of a shunt impedance 62. In operation, a current $i$ applied to the emitter 63 of transistor 60 causes a current $i$ in the collector 64. This current, flowing through impedance 62 produces a voltage $v = iZ_2$ at the base 66 of transistor 61. This, in turn, produces an equal output voltage $V = iZ_2$ at the emitter 65 of transistor 61.

It will be noted that in each of these circuits the input impedance $Z_{in}$ is equal to its output impedance $Z_{out}$. In particular, the input and output impedances for the circuit shown in FIG. 6 are infinite, whereas in the embodiment shown in FIG. 7, these impedances are zero. Thus, if used in an amplifier in accordance with the present invention, the series impedances 17 and 18 are located in the same branch of the circuit, as shown in FIG. 8.

Figure 8:
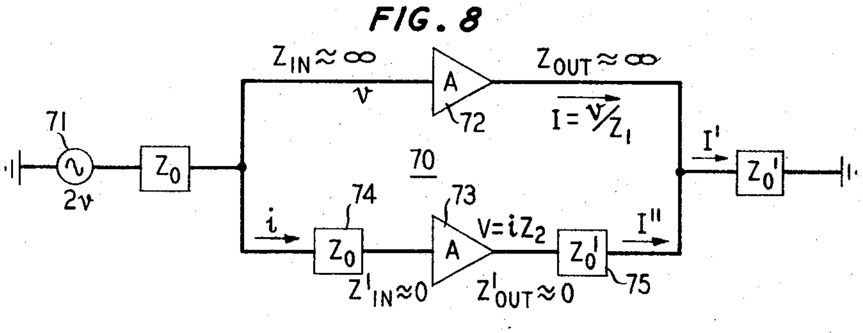
FIG. 8 shows a second embodiment of the invention using the active stages illustrated in FIGS. 6 and 7.

The second embodiment of the invention illustrated in FIG. 8 is essentially the same as that illustrated in FIG. 1 except that active stage 73, being of the type illustrated in FIG. 7, has both low input and low output impedances and, hence, the input and output impedances 74 and 75 are placed in series, respectively, with the input end and the output end of stage 73. Active stage 72, being of the type illustrated in FIG. 6, has both high input and high output impedances.

In operation, signal source 71 produces an input current $i$ in stage 73 and an input voltage $v$ in stage 72. As indicated hereinabove, this, in turn, produces an output voltage $V = iZ_2$ from stage 73 and an output current $I = v/Z_1$ from stage 72. Solving for the stage 73 output current I'', and the load current I in terms of the input current $i$, we obtain $$I' = (Z_1Z_2 + Z_o'Z_o/2Z_1Z_o')\, i\,, \tag{27}$$

and $$I'' = (Z_1Z_2 - Z_o'Z_o/2Z_1Z_o')\, i\,. \tag{28}$$

For the preferred case wherein $I' = i$ and $I''$ is zero, we find from equations (27) and (28) that $$Z_1Z_2 = Z_o'Z_o\,. \tag{29}$$

Equation (29) relates the magnitudes of the series and shunt impedances 51 and 62 in terms of the source and load impedances $Z_o$ and $Z_o'$. In the special case where $Z_o = Z_o'$.

$$Z_1Z_2 = Z_o^2\,. \tag{30}$$

Figure 9:
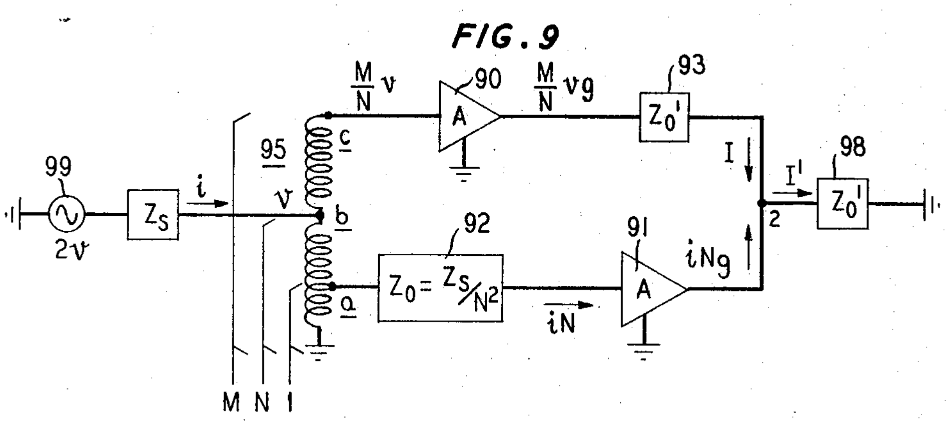
FIGS. 9 and 10 show alternate embodiments of the invention using transformer coupling.

In the illustrative embodiments described thus far, the signal source and the load are connected directly to the input and output ports of the amplifier. It will be recognized, however, that in the some situations, it may be advantageous to make these connections through transformers. Thus, in the illustrative embodiment shown in FIG. 9, the signal source is connected to the two active stages 90 and 91 by means of an autotransformer 95. Specifically, impedance 92, in series with the input end of stage 91, is connected at a point $a$ along transformer 95. Source 99 is connected at a point $b$ on the transformer, while the input end of stage 90 is connected to the upper end $c$ of the transformer. The lower end of the transformer is grounded. The relative turns ratio for these three connections are designated 1: N:M.

The output end of the amplifier is connected directly to load 98. That is, the output end of stage 90 is connected to load 98 through a series impedance 93, while the output end of stage 91 is connected directly to load 98.

Applying the same analysis to this circuit as to the previous circuits, noting only that due to the transformer there are current, voltage and impedance transformations, we obtain, for equal stage gains, a load current $$I' = (Z_oM + Z_o'/2Z_o')\, Ngi\,, \tag{31}$$

and a stage 90 output current $$I = (Z_oM + Z_o'/2Z_o')\, Ngi\,. \tag{32}$$

For the preferred condition where $I = 0$, we obtain, from equation (32), that $$M = Z_o'/Z_o . \quad (33)$$

For a match at the amplifier input, we require that $$N = \sqrt{Z_s/Z_o} . \quad (34)$$

In the usual case where the source impedance $Z_s$ is equal to the load impedance $Z_o'$, we derive, from equations (33) and (34), that $$M/N = N/1 , \quad (35)$$

or that the voltage step-up, M/N, to stage 90, is equal to the current step-up, N/1, to stage 91. Obviously, if the gains of the two stages are different, a different transformer turns ratio and value for $Z_o$ would be required.

Figure 10:
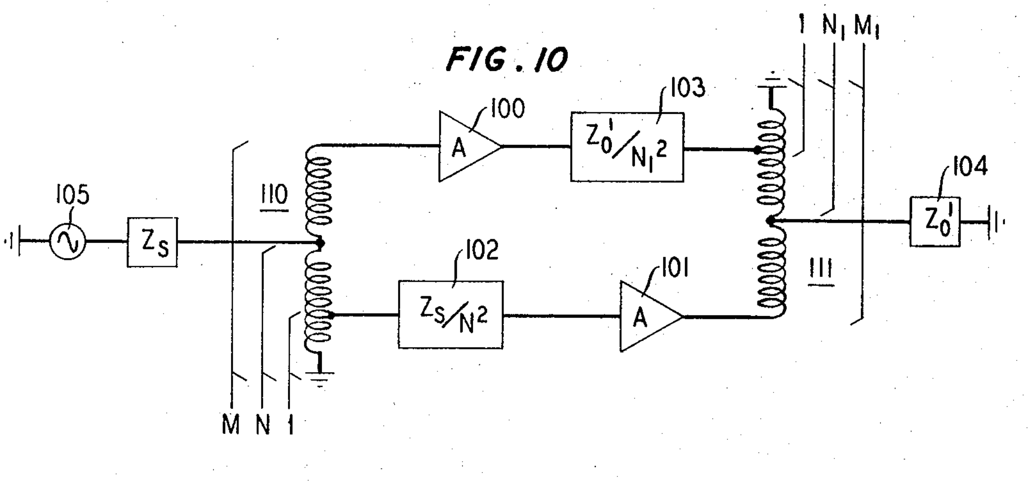

FIG. 10 shows a third embodiment of the invention wherein a transformer is employed at both the input and output ends of the amplifier. Thus, signal source 105 is coupled to stages 100 and 101 through a first autotransformer 110, while the two active stages are coupled to a load 104 through a second autotransformer 111. The transformer turns ratios, 1:N:M and $1:N_1:M_1$, are defined by the magnitudes of the source impedance $Z_s$, input impedance 102, load impedance 104, series impedance 103, and the gains of the stages, as described hereinabove.

It will be recognized that other types of multiwinding transformers can be used instead of autotransformers, and that various combinations of the several embodiments can be devised. Thus, in all cases it is understood that the above-described arrangements are illustrative of but a small number of the many possible specific embodiments which can represent applications of the principles of the invention. Numerous and varied other arrangements can readily be devised in accordance with these principles by those skilled in the art without departing from the spirit and scope of the invention.

I claim:

1. An amplifier for coupling between a signal source and an output load comprising:
   first and second parallel-connected active stages;
   one of said stages having an input impedance that is greater than the impedance of said signal source, while the other of said stages has an input impedance that is less than the impedance of said signal source;
   an input matching impedance connected in series with the input end of said lower input impedance stage;
   one of said stages having an output impedance that is greater than the impedance of said load, while the other of said stages has an output impedance that is less than the impedance of said load;
   and an output matching impedance in series with the output end of said lower output impedance stage.

2. The amplifier according to claim 1 wherein said signal source is connected directly to the higher input impedance stage, and is connected through said input matching impedance to the lower input impedance stage.

3. The amplifier according to claim 2 wherein said input matching impedance is equal to said source impedance.

4. The amplifier according to claim 1 wherein said signal source is connected to said active stages by means of a transformer.

5. The amplifier according to claim 4 wherein said input matching impedance $Z_o$ is equal to $Z_s/N^2$, where $Z_s$ is the source impedance and N:1 is the transformer turns ratio between said source and said input matching impedance.

6. The amplifier according to claim 1 wherein said load is directly connected to the lower output impedance stage and to the higher output impedance stage through said output matching impedance.

7. The amplifier according to claim 6 wherein said output matching impedance is equal to said load impedance.

8. The amplifier according to claim 1 wherein said load is connected to said active stages by means of a transformer.

9. The amplifier according to claim 1 wherein the same active stage has both the higher input and the higher output impedance, while the other stage has both the lower input and the lower output impedance.

10. The amplifier according to claim 1 wherein one stage has the higher input impedance and the lower output impedance, while the other stage has the lower input impedance and the higher output impedance.

11. The amplifier according to claim 1 wherein one of said stages is a transistor connected in a common collector configuration and the other stage is a transistor connected in a common base configuration.

12. The amplifier according to claim 4 wherein:
   said transformer is an autotransformer;
   said higher input impedance stage is connected to one end of said autotransformer;
   said lower input impedance stage is connected to a first tap along said autotransformer through said input matching impedance;
   and wherein said signal source is connected to a second tap along said autotransformer.

13. The amplifier according to claim 1 wherein the input and output impedances differ from said source and load impedances by at least an order of magnitude.

* * * * *

UNITED STATES PATENT OFFICE
CERTIFICATE OF CORRECTION

PATENT NO. : 3,868,584
DATED : February 25, 1975
INVENTOR(S) : Henry Richard Beurrier It is certified that error appears in the above-identified patent and that said Letters Patent are hereby corrected as shown below:

On the Abstract Page, left-hand side, between [76] and [22] insert --Assignee: Bell Telephone Laboratories, Incorporated--.

Signed and sealed this 6th day of May 1975.

(SEAL)
Attest:

RUTH C. MASON
Attesting Officer

C. MARSHALL DANN
Commissioner of Patents and Trademarks